(12) United States Patent
Matheisen et al.

(10) Patent No.: US 11,703,383 B2
(45) Date of Patent: Jul. 18, 2023

(54) VEHICLE WINDOW HAVING AN ANISOTROPIC LIGHT SENSOR

(71) Applicant: SAINT-GOBAIN GLASS FRANCE, Courbevoie (FR)

(72) Inventors: Christopher Matheisen, Herzogenrath (DE); Gabor Varga, Herzogenrath (DE); Richard Stelzer, Aachen (DE); Benjamin Kaplan, Aachen (DE)

(73) Assignee: SAINT-GOBAIN GLASS FRANCE, Courbevoie (FR)

(*) Notice: Subject to any disclaimer, the term of this patent is extended or adjusted under 35 U.S.C. 154(b) by 97 days.

(21) Appl. No.: 17/424,787

(22) PCT Filed: Jan. 8, 2020

(86) PCT No.: PCT/EP2020/050239
§ 371 (c)(1),
(2) Date: Jul. 21, 2021

(87) PCT Pub. No.: WO2020/151942
PCT Pub. Date: Jul. 30, 2020

(65) Prior Publication Data
US 2022/0128398 A1 Apr. 28, 2022

(30) Foreign Application Priority Data
Jan. 22, 2019 (EP) .................................. 19153012

(51) Int. Cl.
*G01J 1/42* (2006.01)
*G01J 1/02* (2006.01)
(Continued)

(52) U.S. Cl.
CPC ............ *G01J 1/4204* (2013.01); *B32B 3/266* (2013.01); *B32B 17/10036* (2013.01);
(Continued)

(58) Field of Classification Search
CPC ............ B32B 2605/08; B32B 2605/18; B32B 2605/12; B32B 2605/006;
(Continued)

(56) References Cited

U.S. PATENT DOCUMENTS 6,521,882 B1  2/2003  Sumiya et al.
9,041,135 B2  5/2015  Janson
(Continued)

FOREIGN PATENT DOCUMENTS

JP   2018-537376 A    12/2018
WO   WO 2017/097536 A1  6/2017
WO   WO 2017/178146 A1  10/2017

OTHER PUBLICATIONS

International Search Report as issued in International Patent Application No. PCT/EP2020/050239, dated Apr. 20, 2020.
(Continued)

*Primary Examiner* — John R Lee
(74) *Attorney, Agent, or Firm* — Pillsbury Winthrop Shaw Pittman LLP

(57) ABSTRACT

A vehicle window with an anisotropic light sensor, has a first glass layer and a second glass layer, wherein an arrangement of light-sensitive elements is arranged, substantially parallel to the first glass layer, between the first glass layer and the second glass layer, wherein the pane furthermore has an aperture such that light can shine through the second glass layer and the aperture onto at least one of the light-sensitive elements, wherein, depending on the direction of incident light, the sensor provides a signal that is indicative of the direction, wherein the arrangement of light-sensitive elements has a camera chip and wherein the arrangement of light-sensitive elements is arranged on a flexible film.

14 Claims, 4 Drawing Sheets

Figure 1:
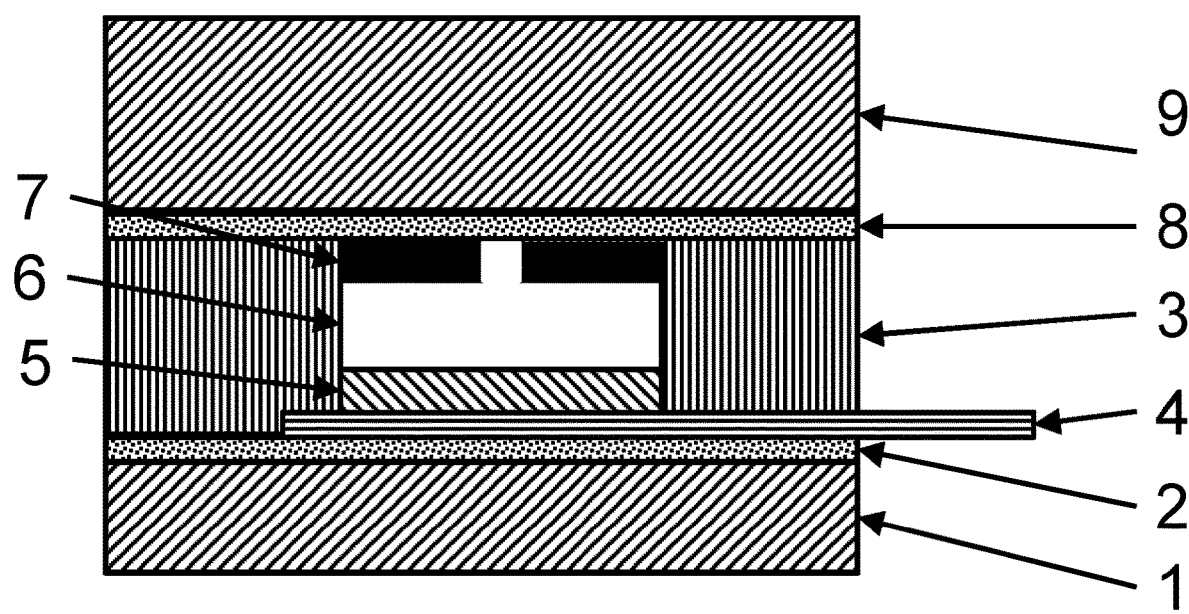

(51) Int. Cl.
  *G01J 1/04* (2006.01)
  *B32B 17/10* (2006.01)
  *B32B 3/26* (2006.01)

(52) U.S. Cl.
  CPC ...... *B32B 17/1055* (2013.01); *B32B 17/1077* (2013.01); *B32B 17/10165* (2013.01); *B32B 17/10724* (2013.01); *B32B 17/10752* (2013.01); *B32B 17/10761* (2013.01); *B32B 17/10779* (2013.01); *G01J 1/0271* (2013.01); *G01J 1/0437* (2013.01); *G01J 1/4228* (2013.01); *B32B 2307/732* (2013.01); *B32B 2605/006* (2013.01); *B32B 2605/12* (2013.01); *B32B 2605/18* (2013.01)

(58) Field of Classification Search
  CPC ..... B32B 2307/732; B32B 3/26; B32B 3/266; B32B 17/10779; B32B 17/1077; B32B 17/10752; B32B 17/10724; B32B 17/1055; B32B 17/10165; B32B 17/10036; B32B 17/10; B32B 17/00; H01L 31/02024; G01S 3/784; G01S 19/00; G01J 1/04; G01J 1/02; G01J 1/0437; G01J 1/0271; G01J 1/0266; G01J 1/42; G01J 1/4204; G01J 1/4228

See application file for complete search history.

(56) References Cited

U.S. PATENT DOCUMENTS

| | | |
|---|---|---|
| 2014/0264700 A1 | 9/2014 | Janson |
| 2018/0111356 A1* | 4/2018 | Effertz ............. B32B 17/10788 |
| 2018/0326705 A1* | 11/2018 | Effertz .................... B60Q 1/00 |
| 2019/0152194 A1* | 5/2019 | Schmalbuch ..... B32B 17/10174 |
| 2022/0128398 A1* | 4/2022 | Matheisen ............ G01J 1/1626 |

OTHER PUBLICATIONS

Notice of Reasons for Refusal as issued in Japanese Patent Application No. 2021-542160, dated Sep. 6, 2022.

* cited by examiner

VEHICLE WINDOW HAVING AN ANISOTROPIC LIGHT SENSOR

CROSS-REFERENCE TO RELATED APPLICATIONS

This application is the U.S. National Stage of PCT/EP2020/050239, filed Jan. 8, 2020, which in turn claims priority to European patent application number 19153012.0 filed Jan. 22, 2019. The content of these applications are incorporated herein by reference in their entireties.

The invention relates to a vehicle window having an anisotropic light sensor.

It is known to equip vehicles with high resolution cameras. These high resolution cameras are used for a wide variety of purposes. However, they rely on additional information, e.g., ambient light detection, to provide their function. The additional information is used, for example, to control shooting parameters, such as that of the aperture, in order to adapt the camera system to changing conditions such that a meaningful image can be provided to the user.

Due to the optics required, these cameras are so voluminous that they cannot be integrated into a vehicle window.

It is also known, for example, to equip vehicle windows with light sensors. Such sensors are used, for example, to detect ambient light and/or as detectors for drops on a vehicle window (rain detector).

Typical sensors are intensity based, with light guided directly or indirectly via a lens and mirror system to a photoresistor/phototransistor/photodiode/light-sensitive element.

However, these sensors are not suitable for distinguishing ambient light from light from other sources, such as sunlight/headlights (e.g., of an oncoming vehicle) or their respective reflections.

In other words, apart from the "light/no light" information and possibly intensity, no further information can be obtained.

Known from U.S. Pat. No. 9,041,135 B2 is a monolithic sun sensor assembly for aircraft, wherein the light-sensitive elements are provided on a semiconductor substrate.

Monolithic sensors are unsuitable for integration into a vehicle window not only because of their size but also because of problems with connection to electronic components.

Another optical sensor is known from U.S. Pat. No. 6,521,882 B1. This is also a stand-alone sensor with a lens assembly. However, the sensor only enables determining an angle of elevation. It does not enable a determination of direction. Likewise, the sensors are unsuitable for integration into a vehicle window not only because of their size, but also because of problems with connection to electronic components.

At the same time, however, there is a need for directional information. In addition, there is a desire to integrate functions in a vehicle window in a space-saving manner.

Based on this situation, an object of the invention is to provide a vehicle window having an anisotropic light sensor.

The object is accomplished by a vehicle window with an anisotropic light sensor, having a first glass layer and a second glass layer, wherein an arrangement of light-sensitive elements is arranged, substantially parallel to the first glass layer, between the first glass layer and the second glass layer, wherein the vehicle window furthermore has an aperture such that light can shine through the second glass layer and the aperture onto at least one of the light-sensitive elements, wherein, depending on the direction of incident light, the sensor provides a signal that is indicative of the direction. The arrangement of light-sensitive elements has a camera chip. In accordance with another embodiment of the invention, the arrangement of light-sensitive elements is arranged on a flexible film.

I.e., the invention provides, in a simple manner, an anisotropic light sensor using which the direction of an incident light can be detected and it is thus possible to distinguish whether it is sunlight or light of an oncoming vehicle. In addition, the invention can build on proven component concepts such that development costs and/or production costs can be kept low. With such an arrangement, curved vehicle windows can, for example, be equipped with the invention.

In one embodiment of the invention, the intermediate space between the aperture and the arrangement of light-sensitive elements has a material with a refractive index less than the refractive index of the second glass layer.

Through suitable selection of refractive indices, the refraction can be suitably set such that, for example, the angle of reflection is greater than the angle of incidence, as result of which the angular resolution can be suitably adjusted.

In another embodiment of the invention, the arrangement of light-sensitive elements has an array-like arrangement of at least 4 light-sensitive elements.

I.e., direction detection can be carried out in a particularly simple manner using quadrant detection.

In yet another embodiment of the invention, a bonding material selected from the group comprising polyimide, polyurethane, polymethylene methacrylic acid, polycarbonate, polyethylene terephthalate, polyvinyl butyral, FR6, acrylonitrile-butadiene-styrene-copolymer, polyethylene, polypropylene, polyvinyl chloride, polystyrene, polybutylene terephthalate, polyamide is arranged between the first glass layer and the second glass layer.

Thus, the invention can also be easily fitted into composite pane systems.

In principle, all electrically insulating substrates that are thermally and chemically stable under the conditions of the production and use of the vehicle window are suitable as the glass layer.

The glass layer preferably contains glass, particularly preferably flat glass, float glass, quartz glass, borosilicate glass, soda lime glass, or clear plastics, preferably rigid clear plastics, in particular polyethylene, polypropylene, polycarbonate, polymethyl methacrylate, polystyrene, polyamide, polyester, polyvinyl chloride, and/or mixtures thereof.

In accordance with yet another embodiment of the invention, the film has a thickness of 50 µm to 500 µm.

In another embodiment of the invention, the aperture is designed as a pinhole aperture. Pinhole apertures can be manufactured particularly easily and can be controlled well in terms of their optical properties.

In yet another embodiment of the invention, the aperture is arranged between the arrangement of light-sensitive elements and the second glass layer at a predetermined distance.

I.e., by providing a preconfigured system, development and production costs can be kept low.

Without loss of generality, the invention also enables providing vehicles having a vehicle window according to the invention. In particular, the vehicle can be a land, water, air, or space vehicle, without excluding mixed forms thereof.

In the following, the invention is explained in detail with reference to drawings and exemplary embodiments. The drawings are a schematic representation and are not to scale. The drawings in no way restrict the invention.

Figure 2:
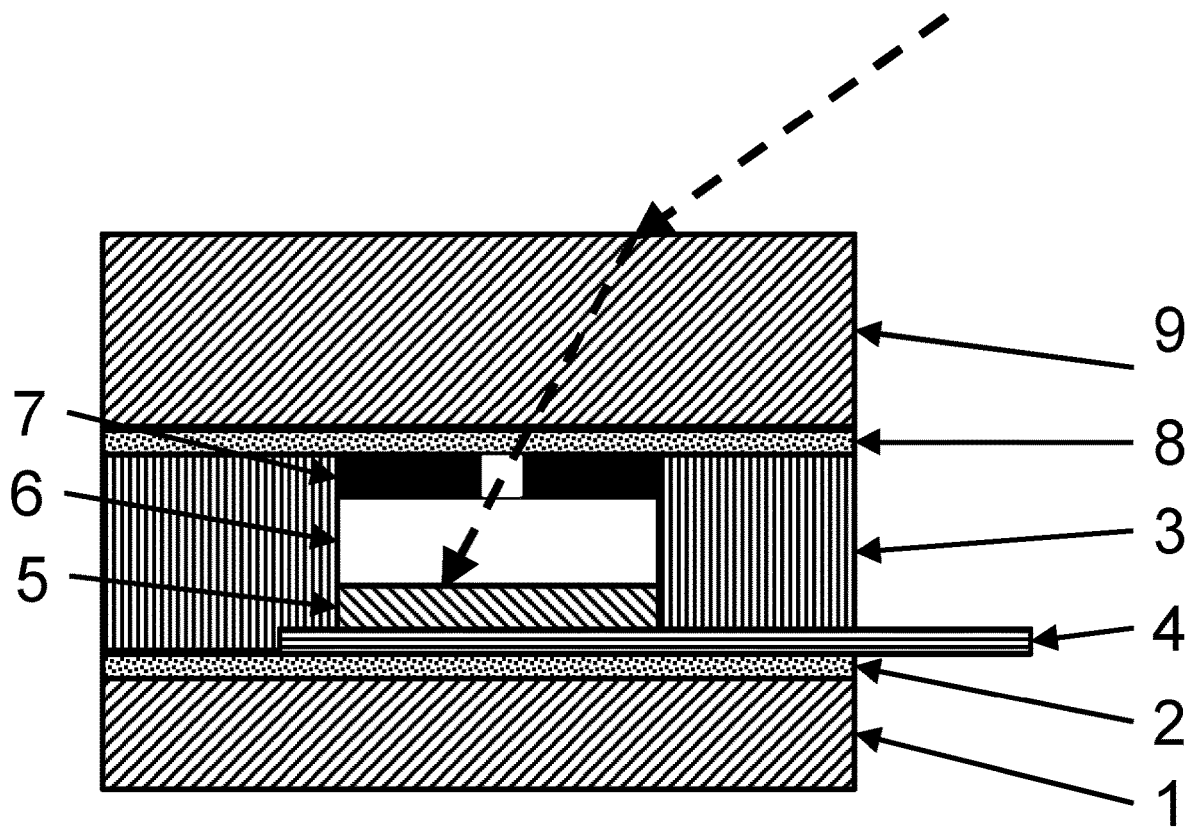
Figure 3:
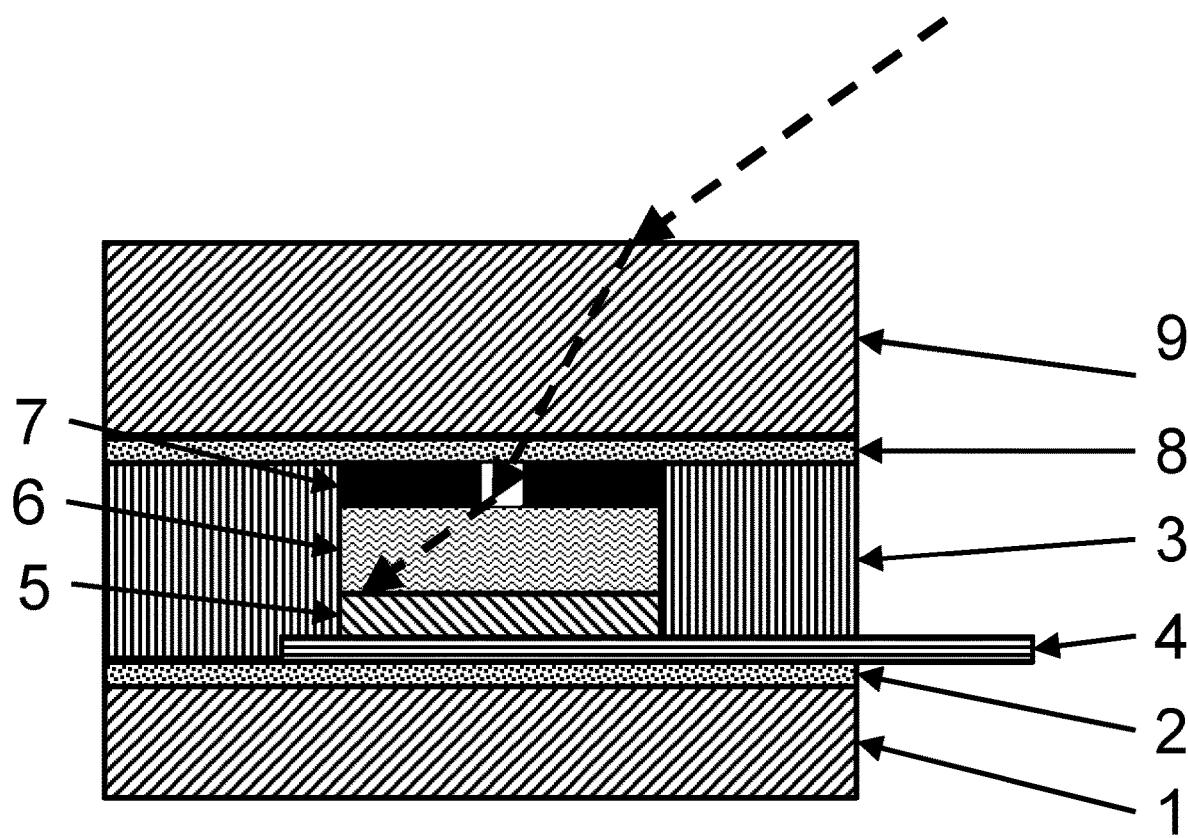
Figure 4:
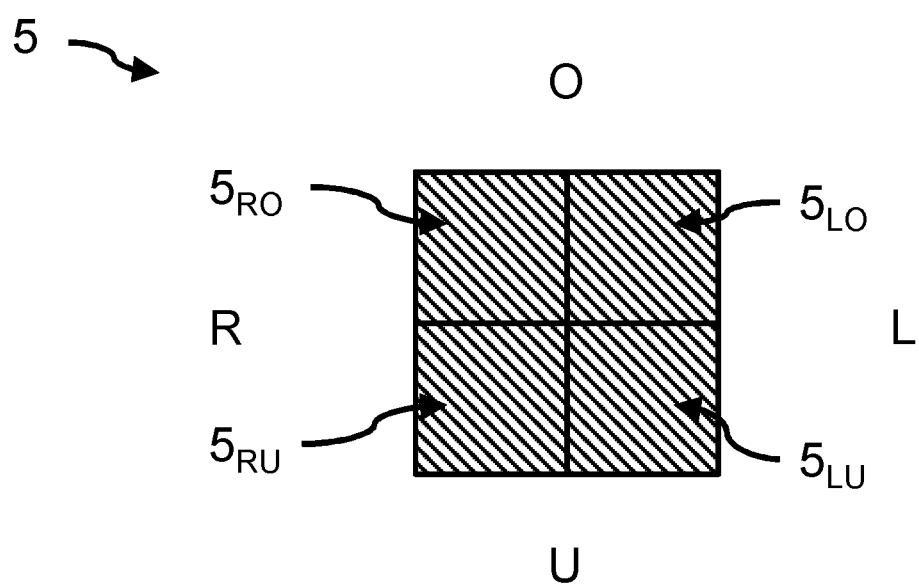

They depict:

FIG. 1 a schematic cross-section relating to arrangement of layers in accordance with aspects of the invention, FIG. 2 a schematic cross-section relating to arrangement of layers in accordance with aspects of the invention and an exemplary incidence of light, FIG. 3 a schematic cross-section relating to arrangement of layers in accordance with aspects of the invention and an exemplary incidence of light, and FIG. 4 a schematic plan view of an arrangement of light-sensitive elements in embodiments of the invention.

In the following, the invention will be presented in more detail with reference to the figures. It should be noted that various aspects are described that can, in each case, be used individually or in combination. In other words, any aspect can be used with different embodiments of the invention unless explicitly presented as a pure alternative.

Furthermore, for the sake of simplicity, in the following, reference is usually always made to only one entity. However, if not explicitly noted, the invention can in each case also have a plurality of the entities concerned. Thus, the use of the words "a" and "an" is to be understood only as an indication that, in a simple embodiment, at least one entity is used.

Insofar as methods are described in the following, the individual steps of a method can be arranged and/or combined in any order unless the context explicitly indicates something different. Furthermore, the methods can be combined with one another—unless explicitly indicated otherwise.

Data with numerical values are usually not to be construed as exact values, but also contain a tolerance from +/−1% up to +/−10%.

Insofar as standards, specifications, or the like are mentioned in this application, at least the standards, specifications, or the like applicable on the filing date are always referenced. I.e., if a standard/specification, etc. is updated or superseded, the invention is also applicable thereto.

The figures depict various embodiments.

FIG. 1-3 schematically depict a vehicle window with an anisotropic light sensor in accordance with embodiments of the invention.

The vehicle window has a first glass layer 1 and a second glass layer 9. The glass layers 1 and 9 can be flat or curved. In the following, it is assumed that the light incidence to be examined occurs through the second glass layer 9.

An arrangement of light-sensitive elements 5 is arranged, substantially parallel to the first glass layer 1, between the first glass layer 1 and the second glass layer 9. Without loss of generality, the arrangement of light-sensitive elements 5 can also be arranged alternatively, or additionally, substantially parallel to the second glass layer 9.

Furthermore, the vehicle window has an aperture such that light can shine through the second glass layer 9 and the aperture 7 onto at least one of the light-sensitive elements 5, wherein, depending on the direction of incident light, the sensor provides a signal that is indicative of the direction.

The invention makes use of the fact—as will now be explained with reference to FIGS. 2 and 3—that by means of the aperture 7, light from different spatial angles in front of the aperture also images at different spatial angles behind the aperture. Thus, an economical pinhole camera is available that permits reliable and economical direction detection without additional optics.

By means of a suitable evaluation circuit, e.g., by means of measuring bridges, comparators, etc., a decision can then be made using electrical signals as to which (rough) spatial direction light entered from. The evaluation circuit can also be integrated into the vehicle window or provided externally.

In other words, the invention provides, in a simple manner, an anisotropic light sensor with the help of which the direction of an incident light can be detected and thus distinguished whether it is sunlight or light of an oncoming vehicle.

In a very simple arrangement, the arrangement of light-sensitive elements 5 has—as depicted in FIG. 4—an array-like arrangement of at least 4 light-sensitive elements.

With the help of this arrangement, it is possible to distinguish light in different directions. If light strikes on only one specific light-sensitive element, a specific spatial angle can be assigned to this light-sensitive element.

If, for example, light strikes the lower right element $5_{RU}$, a first specific spatial angle range can be derived from this. If, for example, light strikes the upper right element $5_{RO}$, a second specific spatial angle range can be derived from this.

If, on the other hand, light strikes both the lower right element $5_{RU}$ and the upper right element $5_{RO}$, it can be concluded that the origin of the light is from the overlap region/boundary region of the first specific spatial angle range and the second specific spatial angle range.

I.e., by means of simple evaluation logic, quadrant detection and, thus, direction detection can already be carried out in a particularly simple manner.

In an embodiment of the invention, the arrangement of light-sensitive elements 5 has a camera chip.

Provision can be made for all or only a subset of the available pixels to be evaluated. Furthermore, provision can be made for adjacent pixels to be evaluated together as a pixel group to ensure fast processing. However, this also entails a loss of spatial angle resolution.

Camera chips also offer the option of evaluating color channels individually. Consequently, it would be possible to obtain, e.g., from different color intensities relating to an angle range, additional data concerning the light source, such as artificial light (light from headlights) or sunlight. With suitable dimensioning which and alignment, even traffic signals, such as traffic lights, warning lights, etc., can be detected. The arrangement enables detection of different light sources even at the same time using different directions (and color composition). In addition, with appropriate resolution, the light-sensitive elements 5 can also provide recognition of spatial structures, such as tunnels, bridges, streetlights, traffic lights.

I.e., The invention can build on proven component concepts such that the development costs and/or production costs can be kept low.

In one embodiment, shown in FIG. 3, the intermediate space 6 between the aperture 7 and the arrangement of light-sensitive elements 5 has a material with a refractive index less than the refractive index of the second glass layer 9. The intermediate space 6 can be filled or can remain as a hollow space.

By a suitable choice of refractive indices, the refraction can be suitably set such that, for example, the angle of reflection is greater than the angle of incidence, as a result of which the angular resolution can be suitably set. In other words, very low heights can also be provided.

In one embodiment of the invention, the vehicle window has a surrounding layer 3 between the first glass layer 1 and the second glass layer 9. The surrounding layer 3 has bonding material selected from the group comprising polyimide, polyurethane, polymethylene methacrylic acid, polycarbonate, polyethylene terephthalate, polyvinyl butyral, FR6, acrylonitrile-butadiene-styrene-copolymer, polyethylene, polypropylene, polyvinyl chloride, polystyrene, polybutylene terephthalate, polyamide.

Thus, the invention can also be easily fitted into composite pane systems.

In embodiments of the invention, the arrangement of light-sensitive elements 5 is arranged on a flexible film 4, e.g., a flexible printed circuit board.

With such an arrangement, curved vehicle windows, for example, can be equipped with the invention.

In another embodiment of the invention, the film 4 has a thickness of 50 µm to 500 µm, in particular approx. 300 µm.

In another embodiment of the invention, the aperture is configured as a pinhole aperture. Pinhole apertures are particularly easy to manufacture and easy to control in terms of their optical properties.

In yet another embodiment of the invention, the aperture 4 is arranged between the arrangement of light-sensitive elements 5 and the second glass layer 9 at a predetermined distance.

The aperture 4 can, for example, have a material thickness of approx. 0.5 mm or less, in particular 0.025 mm or less.

Without loss of generality, the distance between the aperture 7 and the arrangement of light-sensitive elements 5 can be 0.8 or less, in particular 0.6 mm or less.

I.e., by providing a preconfigured system, both development and production costs can be kept low.

Without loss of generality, the invention also enables providing vehicles having a vehicle window according to the invention. In particular, the vehicle can be a land, water, air, or space vehicle, without excluding mixed forms thereof.

The figures depict other optional bonding layers 8 and/or 2. The optional bonding layer 2 can be present alone, as an alternative to, or in combination with an optional bonding layer 8. These optional bonding layers 8 and/or 2 can also be made of the same/similar material as the surrounding layer, i.e., of a composite material. Typically, these optional bonding layers 8 and/or 2 have a thickness of 0.01 mm. By means of the bonding layers, for example, in conjunction with the thickness of the glass layer 9, the angular range can be set to a predefined distance of the aperture 7 from the arrangement of light-sensitive elements 5.

In other words, the invention enables an optical sensor array 5 to be laminated in. This can be implemented as a camera chip. By providing an aperture 7, a simple optical image similar to a pinhole camera is provided.

The optical properties suffice to image a spatial angle range separately such that detection of the spatial angle range of the light source can be carried out effectively.

The direction sensor can be integrated into the vehicle window itself.

By means of such a direction sensor, the brightness of a head-up display, which can be provided on the vehicle window itself, can be controlled, for example, as a function of the direction of sunlight. Furthermore, the directional information (as well as the intensity information) can be made available for other purposes, such as lighting control.

By choosing the distance of the aperture 7 from the arrangement of light-sensitive elements 5 and through the choice of the thickness of a possible intermediate layer 8 and/or the choice of a material for the intermediate space 6, the spatial angle range available for analysis can be suitably selected. By means of the size of the opening of the aperture 7, e.g., 0.5 mm or less, in particular 0.1 mm or less, a suitable resolution can be selected between necessary light intensity and resolution with respect to the distance available between the aperture 7 and the arrangement of light-sensitive elements 5 (and their size).

It should be noted that the arrangement of light-sensitive elements 5 can also be arranged under a possible black print provided it is ensured that light can enter the aperture 7 from a suitable spatial angle range. This can, for example, be provided by a comparatively small cutout.

The arrangement of light-sensitive elements 5, aperture 7, and film 4 can easily be prefabricated as a preassembled structural unit for insertion into a composite glass pane.

The intermediate layer 6 can be made of glass, a polymer, silicon nitride, or the like. It can also have filter functions and/or antireflective properties (e.g. infrared radiation/UV radiation).

LIST OF REFERENCE CHARACTERS 1 first glass layer
2 bonding layer (optional)
3 surrounding layer
4 flexible film
5 arrangement of light-sensitive elements
6 intermediate layer (optional)
7 aperture
8 bonding layer (optional)
9 second glass layer

The invention claimed is:

1. A vehicle window with an anisotropic light sensor, comprising a first glass layer and a second glass layer, wherein an arrangement of light-sensitive elements is arranged, substantially parallel to the first glass layer, between the first glass layer and the second glass layer, wherein the vehicle window further comprises an aperture such that light can shine through the second glass layer and the aperture onto at least one of the light-sensitive elements, wherein the aperture through which the light can shine has a size smaller than a size of the arrangement of light-sensitive elements so that only part of the arrangement of light-sensitive elements is illuminated when the light goes through the aperture such that, depending on a direction of incident light, the sensor provides a signal that is indicative of the direction, wherein the arrangement of light-sensitive elements has a camera chip and wherein the arrangement of light-sensitive elements is arranged on a flexible film.

2. The vehicle window according to claim 1, wherein the intermediate space between the aperture and the arrangement of light-sensitive elements has a material with a refractive index less than the refractive index of the second glass layer.

3. The vehicle window according to claim 1, wherein the arrangement of light-sensitive elements comprises an array-like arrangement of at least 4 light-sensitive elements.

4. The vehicle window according to claim 1, wherein a bonding material selected from the group comprising polyimide, polyurethane, polymethylene methacrylic acid, polycarbonate, polyethylene terephthalate, polyvinyl butyral, FR6, acrylonitrile-butadiene-styrene-copolymer, polyethylene, polypropylene, polyvinyl chloride, polystyrene, polybutylene terephthalate, polyamide is arranged between the first glass layer and the second glass layer.

5. The vehicle window according to claim 4, wherein the film has a thickness of 50 µm to 500 µm.

6. The vehicle window according to claim 1, wherein the aperture is a pinhole aperture.

7. The vehicle window according to claim 1, wherein the aperture is arranged between the arrangement of light-sensitive elements and the second glass layer at a predetermined distance.

8. A vehicle with the vehicle window according to claim 1.

9. The vehicle according to claim 8, wherein the vehicle is a land, water, air, or space vehicle.

10. The vehicle window according to claim 1, wherein the aperture is spaced apart from the light-sensitive elements by an intermediate space that extends from the aperture to the light-sensitive elements such that light can shine through the second glass layer and the aperture through the intermediate space onto at least one of the light-sensitive elements, wherein a surrounding layer surrounds the aperture, the intermediate space and the light-sensitive elements, and wherein the intermediate space through which the light can shine and the surrounding layer are made of different materials.

11. The vehicle window according to claim 10, wherein a refractive index of a material of the intermediate space is less than a refractive index of the second glass layer.

12. The vehicle window according to claim 10, wherein the surrounding layer defines a periphery of the intermediate space.

13. The vehicle window according to claim 10, wherein the intermediate space is a hollow space or is filled and the surrounding layer is made of a material selected from the group comprising polyimide, polyurethane, polymethylene methacrylic acid, polycarbonate, polyethylene terephthalate, polyvinyl butyral, FR6, acrylonitrile-butadiene-styrene-co-polymer, polyethylene, polypropylene, polyvinyl chloride, polystyrene, polybutylene terephthalate, polyamide.

14. The vehicle window according to claim 10, wherein the intermediate space is a hollow space.

* * * * *